(12) United States Patent
Son et al.

(10) Patent No.: US 8,514,648 B2
(45) Date of Patent: Aug. 20, 2013

(54) ANTI-FUSE, ANTI-FUSE CIRCUIT INCLUDING THE SAME, AND METHOD OF FABRICATING THE ANTI-FUSE

(75) Inventors: Jong-Pil Son, Yongin-si (KR);
Seong-Jin Jang, Seongnam-si (KR);
Byung-Sik Moon, Seoul (KR);
Doo-Young Kim, Seongnam-si (KR);
Hyoung-Joo Kim, Seongnam-si (KR);
Ju-Seop Park, Seongnam-si (KR)

(73) Assignee: Samsung Electronics Co., Ltd., Yeongtong-gu, Suwon-si Gyeonggi-do (KR)

( * ) Notice: Subject to any disclaimer, the term of this patent is extended or adjusted under 35 U.S.C. 154(b) by 217 days.

(21) Appl. No.: 13/051,998

(22) Filed: Mar. 18, 2011

(65) Prior Publication Data
US 2011/0267915 A1 Nov. 3, 2011

(30) Foreign Application Priority Data
Apr. 28, 2010 (KR) ........................ 10-2010-0039538

(51) Int. Cl.
*G11C 17/18* (2006.01)

(52) U.S. Cl.
USPC ........... 365/225.7; 257/E27.06; 257/E29.255; 257/368; 257/288

(58) Field of Classification Search
USPC .................. 365/225.7; 257/E27.06, E29.255, 257/368, 288
See application file for complete search history.

(56) References Cited

U.S. PATENT DOCUMENTS

| 5,811,869 | A | 9/1998 | Seyyedy et al. |
| 6,812,122 | B2 | 11/2004 | Bertin et al. |
| 2004/0261049 | A1* | 12/2004 | Mohr et al. ................ 716/16 |
| 2005/0007855 | A1* | 1/2005 | Lee et al. .................. 365/225.7 |
| 2007/0122981 | A1* | 5/2007 | Park ........................... 438/275 |
| 2008/0090363 | A1* | 4/2008 | Manabe et al. ............. 438/289 |
| 2008/0237673 | A1 | 10/2008 | Wada et al. |
| 2009/0218637 | A1* | 9/2009 | Gomikawa et al. ......... 257/402 |

FOREIGN PATENT DOCUMENTS

| JP | 11-502068 | 2/1999 |
| JP | 2008-091451 | 4/2008 |
| KR | 10-0323174 | 7/1997 |
| KR | 10-0416860 | 7/2001 |

* cited by examiner

*Primary Examiner* — Fernando Hidalgo
(74) *Attorney, Agent, or Firm* — Muir Patent Consulting, PLLC

(57) ABSTRACT

Provided are an anti-fuse, an anti-fuse circuit, and a method of fabricating the anti-fuse. The anti-fuse includes a semiconductor substrate, an isolation region, a channel diffusion region, a gate oxide layer, and a gate electrode. The semiconductor substrate includes a top surface and a bottom portion, the bottom portion of the semiconductor substrate having a first conductivity type. The isolation region is disposed inward from the top surface of the semiconductor substrate to a first depth. The channel diffusion region is disposed inward from the top surface of the semiconductor substrate to a second depth, the second depth located at a depth where the channel diffusion region meets an upper boundary of the bottom portion of the semiconductor substrate. The channel diffusion region is surrounded by the isolation region, the first depth is a greater distance from the top surface of the semiconductor substrate than the second depth, and the channel diffusion region has a second conductivity type opposite to the first conductivity type. The gate oxide layer is disposed on the channel diffusion region, and the gate electrode is disposed on the gate oxide layer to cover a top surface of the gate oxide layer.

21 Claims, 10 Drawing Sheets

ANTI-FUSE, ANTI-FUSE CIRCUIT
INCLUDING THE SAME, AND METHOD OF
FABRICATING THE ANTI-FUSE

CROSS-REFERENCE TO RELATED
APPLICATION

This application claims priority under 35 U.S.C. §119 to Korean Patent Application No. 10-2010-0039538 filed on Apr. 28, 2010, the disclosure of which is hereby incorporated by reference in its entirety.

BACKGROUND

1. Field

Embodiments of the inventive concept relate to a semiconductor device and, more particularly, to a semiconductor device including an anti-fuse circuit.

2. Description of Related Art

A fuse or anti-fuse may be used for a semiconductor device, especially a semiconductor memory device. The fuse may be turned off when conditions are satisfied, and the anti-fuse is turned on when the conditions are satisfied. The fuse or anti-fuse may be used to select an operation mode of the semiconductor device or enable a redundancy array when a memory cell array includes a defective cell.

In recent years, a metal-oxide-semiconductor field-effect-transistor (MOSFET) including a thin gate oxide layer has been used for an anti-fuse.

However, when the gate oxide layer is broken in the anti-fuse using the MOSFET, a leakage current may flow through a semiconductor substrate, and operation of the semiconductor device may be degraded.

SUMMARY

Embodiments of the inventive concept provide an anti-fuse, which may improve a dispersion characteristic according to the position of a broken point after breakdown of a gate oxide layer and reduce a leakage current flowing through a bulk.

Embodiments of the inventive concept also provide a semiconductor memory device including the anti-fuse.

Embodiments of the inventive concept also provide a memory system including the anti-fuse.

Embodiments of the inventive concept also provide a semiconductor device including the anti-fuse.

Embodiments of the inventive concept also provide a method of fabricating an anti-fuse, which may improve a dispersion characteristic according to the position of a broken point after breakdown of a gate oxide layer and reduce a leakage current flowing through a bulk.

In accordance with a first embodiment, an anti-fuse comprising a semiconductor substrate, an isolation region, a channel diffusion region, a gate oxide layer, and a gate electrode. The semiconductor substrate includes a top surface and a bottom portion, the bottom portion of the semiconductor substrate having a first conductivity type. The isolation region is disposed inward from the top surface of the semiconductor substrate to a first depth. The channel diffusion region is disposed inward from the top surface of the semiconductor substrate to a second depth, the second depth located at a depth where the channel diffusion region meets an upper boundary of the bottom portion of the semiconductor substrate. The channel diffusion region is surrounded by the isolation region, the first depth is a greater distance from the top surface of the semiconductor substrate than the second depth, and the channel diffusion region has a second conductivity type opposite to the first conductivity type. The gate oxide layer is disposed on the channel diffusion region, and the gate electrode is disposed on the gate oxide layer to cover a top surface of the gate oxide layer.

In one embodiment, the gate electrode has the second conductivity type. In another embodiment, the isolation region is a shallow trench isolation (STI) region.

In a further embodiment, the anti-fuse further comprises a drain region partially overlapping the gate oxide layer. The drain region is formed inward from the surface of the channel diffusion region, and has the second conductivity type. The anti-fuse additionally comprises a source region partially overlapping the gate oxide layer. The source region is formed at a first distance from the drain region in a horizontal direction, and having the second conductivity type.

In another embodiment, a first edge of the channel diffusion region is adjacent to the isolation region, and a second edge opposite to the first edge is also adjacent to the isolation region.

In another embodiment, each of the drain region and source region has an impurity concentration higher than an impurity concentration of the channel diffusion region.

In a further embodiment, the gate electrode is connected to a voltage source, the drain region is connected to a ground, and the source region is floating. The anti-fuse may be configured such that the gate oxide layer is configured to break, forming an ohmic contact between the gate electrode and the substrate, and after the gate oxide layer is broken, when a voltage is applied to the gate electrode, a current flows from the gate electrode to ground through the drain region.

In one embodiment, the gate oxide layer has a length of L in the horizontal direction, and the anti-fuse is configured such that: if the gate oxide layer breaks at a first distance L1 along the length L of the gate oxide layer, and a first voltage is applied to the gate electrode, a first current having a first value flows between the gate electrode and ground through the drain region; and if the gate oxide layer breaks at a second distance L2 different from L1 along the length L of the gate oxide layer, and the first voltage is applied to the gate electrode, a second current having a second value flows between the gate electrode and ground through the drain region. In one embodiment, for any L1 or L2 wherein a first voltage between 2 V and 3 V is applied to the gate electrode, a variation between the first current and the second current is less than 30%.

In one embodiment, the anti-fuse is part of an anti-fuse circuit. The anti-fuse circuit includes a plurality of anti-fuse cells, one including the anti-fuse, each anti-fuse cell disposed to a smaller depth than an isolation region inward from a top surface of the semiconductor substrate and having a channel diffusion region having a conductivity type opposite to a conductivity type of the semiconductor substrate, a gate to which a first voltage is applied, and a floated source. The anti-fuse circuit also includes a plurality of transistors, each transistor having a drain connected to a corresponding one of the anti-fuse cells, a gate to which a word line drive signal is applied, and a source connected to a corresponding bit line.

In one embodiment, when in a program mode, the first voltage is applied to a gate of each of the anti-fuse cells, and a low voltage is applied to a bit line electrically connected to an anti-fuse cell to be programmed. In another embodiment, when in a program mode, the word line drive signal has a half voltage level of the first voltage. In another embodiment, when in a program mode, a voltage having a half voltage level of the first voltage is applied to a bit line electrically connected to an anti-fuse cell to be unprogrammed.

In another embodiment of the inventive concept, a semiconductor device including a plurality of anti-fuse cells and a plurality of isolation regions is disclosed. The plurality of anti-fuse cells are adjacent each other. Each includes a semiconductor substrate including a top surface, the semiconductor substrate comprising a first region extending inward from the top surface of the semiconductor substrate to a first depth and having a first conductivity type, and a second region extending from the first depth toward a bottom of the semiconductor substrate and having a second conductivity type opposite the first conductivity type; a gate oxide layer disposed on the first region; and a gate electrode disposed on the gate oxide layer to cover a top surface of the gate oxide layer. The plurality of isolation regions extend inward from the top surface to a second depth greater than the first depth. Each isolation region surrounds a respective anti-fuse cell, and separates the respective anti-fuse cell from an adjacent anti-fuse cell.

In a further embodiment, the second region extends below the first region for each cell as well as below the plurality of isolation regions. In another embodiment, for each cell, the gate electrode has the first conductivity type.

In a one embodiment, for each cell, the first region includes a source region and a drain region, the gate electrode is connected to a voltage source, the drain region is connected to a ground, and the source region is floating.

In an additional embodiment, for each cell, the gate oxide layer is configured to break, forming an ohmic contact between the gate electrode and the substrate, and after the gate oxide layer is broken, when a voltage is applied to the gate electrode, a current flows from the gate electrode to ground through the drain region. The gate oxide layer has a length of L in the horizontal direction. The cell is configured such that if the gate oxide layer breaks at a first distance L1 along the length L of the gate oxide layer, and a first voltage is applied to the gate electrode, a first current having a first value flows between the gate electrode and ground through the drain region; and if the gate oxide layer breaks at a second distance L2 different from L1 along the length L of the gate oxide layer, and the first voltage is applied to the gate electrode, a second current having a second value flows between the gate electrode and ground through the drain region. In one embodiment, for any L1 or L2 wherein a first voltage between 2 V and 3 V is applied to the gate electrode, a variation between the first current and the second current is less than 30%.

In a further embodiment, the semiconductor device further includes a memory cell array connected to word lines and column selection lines; a column decoder configured to decode column address signals, generate column selection signals, and transmit the column selection signals to the column selection lines; a row decoder configured to decode row address signals and generate row address signals; and one or more of: a redundant memory cell array connected to redundant word lines and redundant column selection lines; a redundant column decoder configured to decode the column address signals, generate redundant column selection signals, and transmit the redundant column selection signals to the redundant column selection lines when a defect occurs in the column decoder or at least one of the column selection lines; and a redundant row decoder configured to decode the row address signals and generate redundant row address signals when a defect occurs in the row decoder. At least one of the redundant memory cell array, the redundant column decoder, and the redundant row decoder includes the plurality of anti-fuse cells and the plurality of isolation regions.

In another embodiment of the inventive concept, a semiconductor device comprises a first circuit block, a redundant circuit block, and an anti-fuse circuit. The first circuit block is configured to perform an operation. The redundant circuit block is also configured to perform the operation. The anti-fuse circuit is included in the redundant circuit block and is electrically connected to a voltage source. The anti-fuse circuit configured to activate the redundant circuit block by applying a voltage from the voltage source to the redundant circuit block. The anti-fuse circuit includes a plurality of anti-fuse cells adjacent each other. Each cell includes a semiconductor substrate including a top surface, the semiconductor substrate comprising a first region extending inward from the top surface of the semiconductor substrate to a first depth and having a first conductivity type, and a second region extending from the first depth toward a bottom of the semiconductor substrate and having a second conductivity type opposite the first conductivity type; a gate oxide layer disposed on the first region; and a gate electrode disposed on the gate oxide layer to cover a top surface of the gate oxide layer, the gate electrode connected to the voltage source. The anti-fuse circuit further includes a plurality of isolation regions extending inward from the top surface to a second depth greater than the first depth. Each isolation region surrounds a respective anti-fuse cell, and separates the respective anti-fuse cell from an adjacent anti-fuse cell.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION

Figure 1:
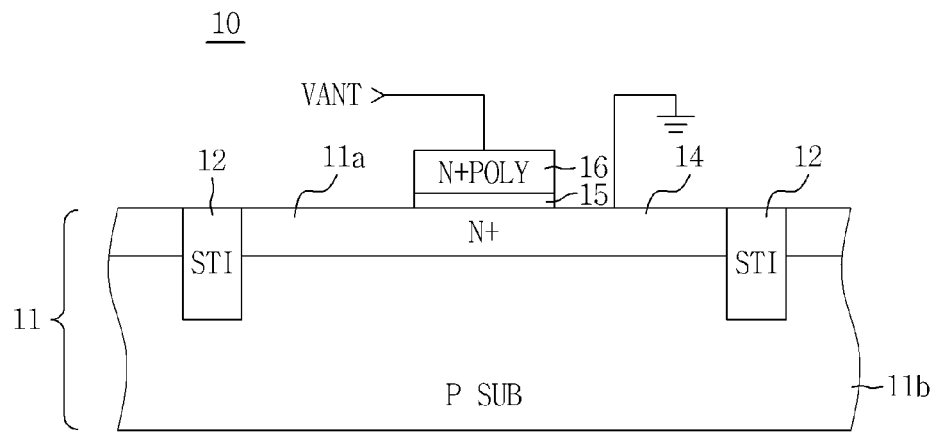
FIG. 1 is a cross-sectional view of a vertical structure of an anti-fuse according to exemplary embodiments of the inventive concept.

Since embodiments of the present inventive concept are provided only for structural and functional descriptions of the present inventive concept, the inventive concept should not be construed as limited to the embodiments set forth herein. Thus, it will be clearly understood by those skilled in the art that the embodiments of the present inventive concept may be embodied in different forms and include all variations, equivalents, and substitutes that can realize the spirit of the present inventive concept.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Meanwhile, spatially relative terms, such as "between" and "directly between" or "adjacent to" and "directly adjacent to" and the like, which are used herein for ease of description to describe one element or feature's relationship to another element(s) or feature(s) as illustrated in the figures, should be interpreted similarly.

The terminology used herein is for the purpose of describing particular embodiments only and is not intended to be limiting of the inventive concept. As used herein, the singular forms "a," "an" and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Spatially relative terms, such as "between," "upper," "lower," "adjacent to," "on" and the like, which are used herein for ease of description to describe one element or feature's relationship to another element(s) or feature(s) as illustrated in the figures, should be interpreted in relation to each other. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless expressly defined in a specific order herein, respective steps described in the present inventive concept may be performed otherwise. That is, the respective steps may be performed in a specified order, substantially at the same time, or in reverse order.

Hereinafter, an anti-fuse, an anti-fuse circuit including the same, and a method of fabricating the anti-fuse according to embodiments of the inventive concept will be described with reference to the appended drawings.

Figure 2:
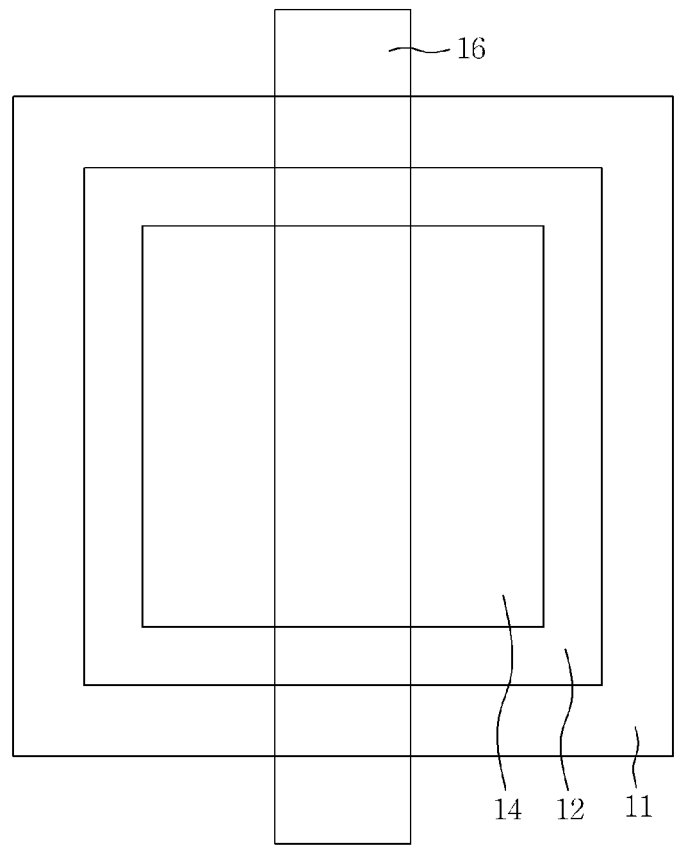
FIG. 2 is an exemplary plan view of a horizontal structure of the anti-fuse of FIG. 1.

FIG. 1 is a cross-sectional view of a vertical structure of an anti-fuse according to exemplary embodiments of the inventive concept, and FIG. 2 is a plan view of a horizontal structure of the anti-fuse of FIG. 1.

Referring to FIG. 1, in one embodiment, an anti-fuse 10 includes a semiconductor substrate 11, an isolation region 12, a channel diffusion region 14, a gate oxide layer 15, and a gate electrode 16.

Referring to FIG. 1, the semiconductor substrate 11 may include a top surface 11a, and a bottom portion 11b. The semiconductor substrate 11 may also include a channel diffusion region 14. The bottom portion 11b may be formed of a material having a first conductivity type (e.g., a p-type semiconductor material), and the channel diffusion region 14 may be formed of a material having a second, opposite conductivity type (e.g., a n-type semiconductor material) to the semiconductor substrate 11. For example, the p-type semiconductor material may be silicon to which a group III element of the periodic table is applied, and the n-type semiconductor material may be silicon to which a group V element of the periodic table is applied. Although the bottom portion 11b of the substrate 11 is described herein as a P-type material, alternatively, the bottom portion 11b of the substrate 11 may be formed of an N-type semiconductor material and the channel diffusion region 14 may be formed of an opposite (e.g., P-type) semiconductor material.

In one embodiment, the isolation region 12 is formed inward from a top surface 11a of the semiconductor substrate 11. As shown in FIG. 1, the isolation region 12 may be a shallow-trench-isolation (STI) region. The channel diffusion region 14 may be surrounded by the isolation region 12 and formed inward from the top surface of the semiconductor substrate 11 to a smaller depth than the isolation region 12. For example, the isolation region 12 can be disposed inward from the top surface 11a of the semiconductor substrate 11 to a first depth, and the channel diffusion region 12 can be disposed inward from the top surface 11a of the semiconductor substrate 11 to a second depth, wherein the second depth is located at a depth where the channel diffusion region meets an upper boundary of the bottom portion 11b of the semiconductor substrate 11. In the embodiment shown in FIG. 1, the first depth is a greater distance from the top surface 11a of the semiconductor substrate 11 than the second depth.

The channel diffusion region 14 may be formed, for example, using an ion implantation process or a chemical vapor deposition (CVD) process. In one embodiment, the gate oxide layer 15 is formed on the channel diffusion region 14, and the gate electrode 16 is formed on the gate oxide layer 15 to cover a top surface of the gate oxide layer 15. In one embodiment, the gate electrode 16 of the anti-fuse 10 of FIG. 1 is formed of $N^+$-type polysilicon (poly-Si). Here, an $n^+$-type material refers to a material doped at a higher dopant concentration than an n-type material.

The anti-fuse 10 of FIG. 1 includes the channel diffusion region 14, which may be formed inward from the top surface 11a of the semiconductor substrate 11 to have an opposite conductivity type to the bottom portion 11b of the semiconductor substrate 11. When an anti-fuse voltage VANT, which in one embodiment is a high voltage, is applied to the gate electrode 16 and a ground voltage is applied to a drain terminal (not shown), a current path may lead from the gate electrode 16 through the $N^+$-type channel diffusion region 14 to the drain terminal. As a result, an ohmic contact (not shown) may be formed between the gate electrode 16 and the $N^+$-type channel diffusion region 14, and a parasitic current flowing from the gate electrode 16 to the bottom portion 11a of the semiconductor substrate 11 (e.g., the P-type region) may be negligible. The ohmic contact may be a point-type contact formed through the gate oxide layer 15 that has a low enough resistivity to conduct a current between the gate electrode 16 and the substrate 11.

Thus, in the anti-fuse 10 of FIG. 1, because the channel diffusion region 14 is an N+-type material, a channel may be formed in the $N^+$-type channel diffusion region 14 under the gate oxide layer 15 to reduce a parasitic current flowing through a bulk (e.g., flowing through the P-type region of the substrate 11).

Referring to a plan view 10a of the anti-fuse of FIG. 2, the isolation region 12 may be formed in the semiconductor substrate 11, and the channel diffusion region 14 may be surrounded by the isolation region 12. That is, the edges of the channel diffusion region 14, in one embodiment, are adjacent to and contact the isolation region 12. The gate electrode 16 may be formed over the center of the channel diffusion region 14. As further depicted in FIG. 1, the anti-fuse 10 may be part of a series of adjacent anti-fuses separated by the isolation region 12.

Figure 3:
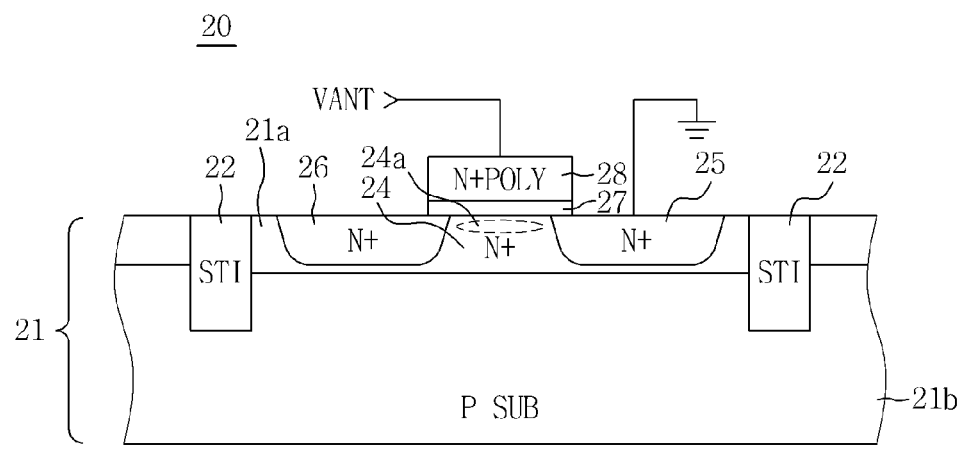
FIG. 3 is a cross-sectional view of a vertical structure of an anti-fuse according to other exemplary embodiments of the inventive concept.
Figure 4:
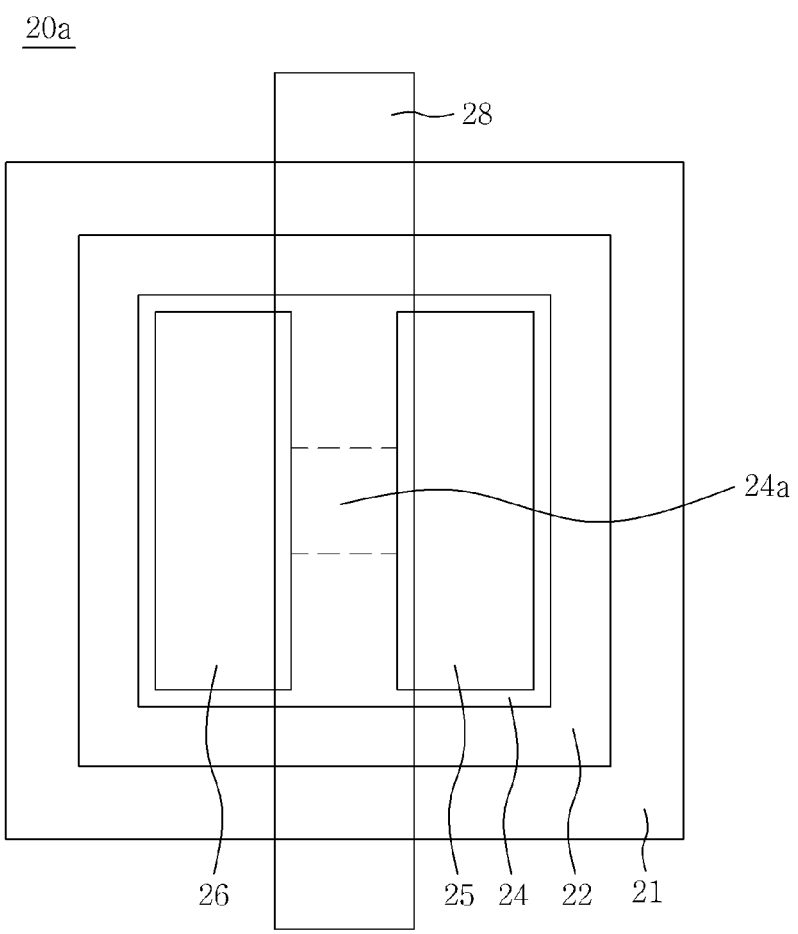
FIG. 4 is an exemplary plan view of a horizontal structure of the anti-fuse of FIG. 3.

FIG. 3 is a cross-sectional view of a vertical structure of an anti-fuse according to other exemplary embodiments of the inventive concept, and FIG. 4 is a plan view of a horizontal structure of the anti-fuse of FIG. 3.

Referring to FIG. 3, an anti-fuse 20 may include a semiconductor substrate 21, an isolation region 22, a channel diffusion region 24, a gate oxide layer 27, a gate electrode 28, a drain region 25, and a source region 26. A portion of the channel diffusion region 24, which may be disposed between the source and drain regions 26 and 25 under the gate oxide layer 27, may correspond to a channel 24a, which may be a current path between the gate electrode 28 and a drain terminal.

Referring to FIG. 3, a semiconductor substrate 21 may include a top surface 21a, and a bottom portion 21b. The semiconductor substrate 21 may also include a channel diffusion region 24. The bottom portion 21b may be a material having a first conductivity type (e.g., P-type semiconductor material), and channel diffusion region 24 may be formed of a material having a second, opposite conductivity type (e.g., N-type or $N^+$-type semiconductor material, though an N+-type material is depicted in FIG. 3). An isolation region 22 may be formed inward from a top surface 21a of the semiconductor substrate 21. Referring to FIG. 3, the isolation region 22 may be an STI region. The channel diffusion region 24 may be surrounded by the isolation region 22 and formed inward from a top surface 21a of the semiconductor substrate 21 to a smaller depth than the isolation region 22. For example, the isolation region 22 can be disposed inward from the top surface 21a of the semiconductor substrate 21 to a first depth, and the channel diffusion region 22 can be disposed inward from the top surface 21a of the semiconductor substrate 21 to a second depth, wherein the second depth is located at a depth where the channel diffusion region meets an upper boundary of the bottom portion 21b of the semiconductor substrate 21. In the embodiment shown in FIG. 2, the first depth is a greater distance from the top surface 21a of the semiconductor substrate 21 than the second depth.

The channel diffusion region 24 may be formed, for example, using an ion implantation process or a CVD process. In one embodiment, a gate oxide layer 27 is formed on the channel diffusion region 24, and a gate electrode 28 is formed on the gate oxide layer 27 to cover a top surface of the gate oxide layer 27. In one embodiment, the gate electrode 28 of the anti-fuse 20 of FIG. 3 may be formed of a material having the same conductivity type as the channel diffusion region 24 (e.g, N or $N^+$-type poly-Si). For the purposes of this disclosure, a conductivity type refers to a positive or negative type doping, and a doping or impurity concentration refers the level of doping (e.g., N versus N+ doping). In one embodiment, source region 26 and drain region 25 have the conductivity type as the channel diffusion region 24. Source region 26 and/or drain region 25 may have the same impurity concentration as channel diffusion region 24 (as shown in FIG. 3), or may have a different impurity concentration (e.g., they may have a higher impurity concentration, such that source region 26 and drain region 25 have an N+-type material and channel diffusion region has a N-type material).

As described above, the anti-fuse 20 of FIG. 3 may include the channel diffusion region 24, which may include a source region 26 and a drain region 25, all of which may be formed inward from the top surface 21a of the semiconductor substrate 21 and may have an opposite conductivity type as the bottom portion 21b of semiconductor substrate 21. When an anti-fusing voltage VANT, which in one embodiment is a high voltage, is applied to the gate electrode 28 and a ground voltage is applied to a drain terminal, the gate oxide layer 27 may be partially broken, and current path may lead from the gate electrode 28 through the channel diffusion region 24 and the drain region 25 to the drain terminal and to ground. When the oxide layer 27 is broken, it may be broken at a point along the horizontal length of the oxide layer to form an ohmic contact between the gate electrode 28 and the channel diffusion region 24. As a result, a parasitic current flowing from the gate electrode 28 to the P-type semiconductor substrate 21 may be negligible.

Thus, in the anti-fuse 20 of FIG. 3, a channel may be formed in the channel diffusion region 24 under the gate oxide layer 27 so that when breakdown of the gate oxide layer 27 occurs, a parasitic current flowing through a bulk may be reduced.

Referring to a plan view 20a of the anti-fuse of FIG. 4, the isolation region 22 may be formed in the semiconductor substrate 21, and the channel diffusion region 24 may be surrounded by the isolation region 22. That is, the edges of the channel diffusion region 24, in one embodiment, are adjacent to and contact the isolation region 22. The gate electrode 28 may be formed over the center of the channel diffusion region 24. As further depicted in FIG. 2, the anti-fuse 10 may be part of a series of anti-fuses separated by the isolation region 12.

The drain region 25 and the source region 26 may be respectively disposed on left and right sides of the gate electrode 28. The drain region 25 may partially overlap and adjoin the gate oxide layer (refer to 27 in FIG. 3) and be formed inward from the surface of the channel diffusion region 24. The source region 26 may also partially overlap and adjoin the gate oxide layer (refer to 27 in FIG. 3) and be formed at a first distance from the drain region 25 in a horizontal direction. A channel may be formed between the source and drain regions 26 and 25.

Figure 5:
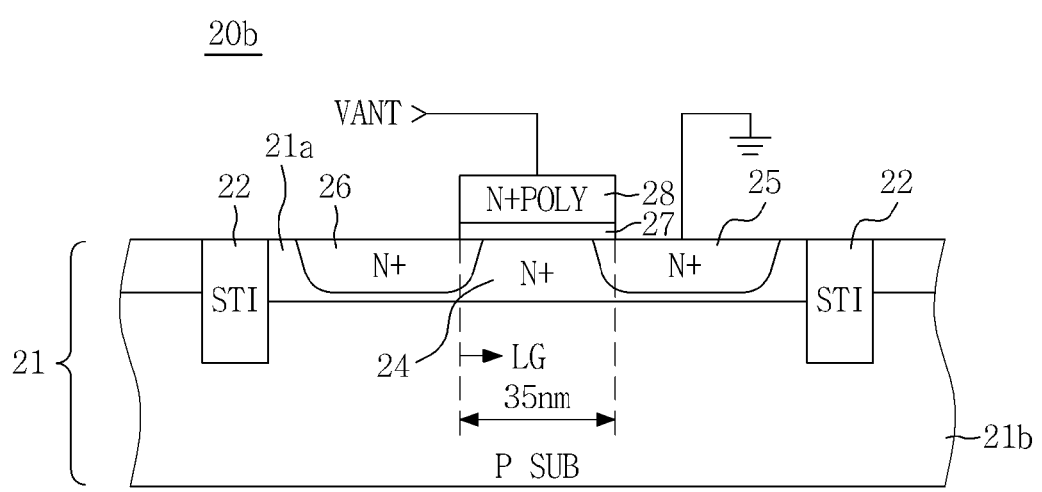
FIG. 5 is an exemplary diagram for explaining a drain current according to the position of a channel in the anti-fuse of FIG. 3.

FIG. 5 is an exemplary diagram for explaining a drain current according to the position of a channel in the anti-fuse of FIG. 3.

Figure 6:
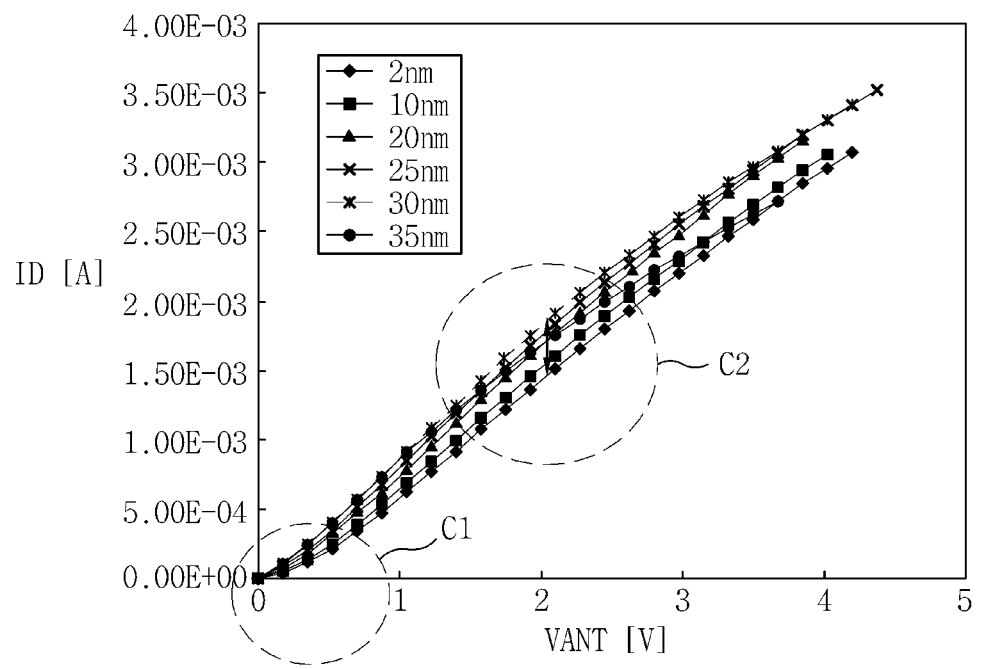
FIG. 6 is an exemplary graph showing a drain current according to the position of a channel where breakdown of a gate oxide layer occurs, in an anti-fuse according to embodiments of the inventive concept.
Figure 7:
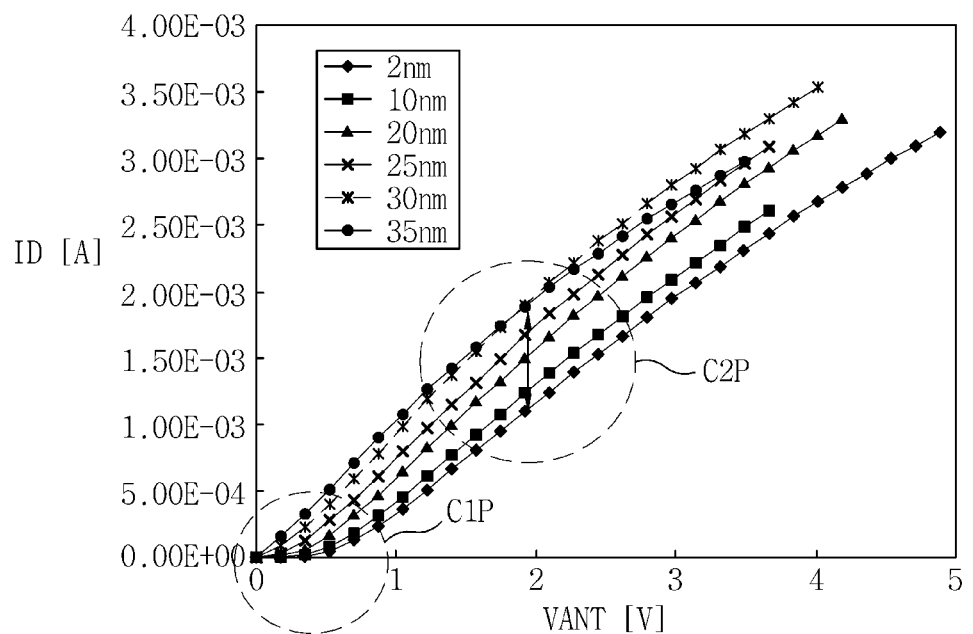
FIG. 7 is an exemplary graph showing a drain current according to the position of a channel where breakdown of a gate oxide layer occurs, in a conventional anti-fuse.

FIG. 6 is an exemplary graph showing a drain current according to the position of a channel where breakdown of a gate oxide layer occurs, in an anti-fuse according to embodiments of the inventive concept, and FIG. 7 is an exemplary graph showing a drain current according to the position of a channel where breakdown of a gate oxide layer occurs, in a conventional anti-fuse.

Referring to FIG. 6, each of five curves shows a drain current relative to a distance LG between a left edge of the gate oxide layer (refer to 27 in FIG. 5) and a point where breakdown of the gate oxide layer 27 occurs. As depicted in FIG. 5, in one embodiment, the gate oxide layer 27 may have a length of 35 nm, such that a channel length between the source region 26 and drain region 25 is about 35 nm. FIGS. 6 and 7 each show drain currents measured when the distances LG are 2 nm, 10 nm, 20 nm, 25 nm, 30 nm, and 35 nm, respectively.

Referring to FIG. 6, it may be seen that a difference between a drain current measured when the distance LG was 2 nm (i.e., the drain current measured when oxide layer 27 breakdown occurred near the left edge of the gate oxide layer 27) and a drain current measured when the distance LG was 35 nm (i.e., the drain current measured when oxide layer 27 breakdown occurred near a right edge of the gate oxide layer 27) in an anti-fuse 20 having an N$^+$-type channel diffusion region 24 according to embodiments was smaller than in the conventional anti-fuse of FIG. 7.

For instance, referring to C1 of FIG. 6, in the anti-fuse 20 having the N$^+$-type channel diffusion region 24 according to the embodiments, when the distance LG was 2 nm and an anti-fusing voltage VANT applied to the gate electrode 28 was close to about 0 V, current started to flow almost immediately (e.g., after the voltage increased past about 0.1 V). However, referring to C1P of FIG. 7, in the conventional anti-fuse without an N$^+$-type channel diffusion region, when the distance LG was 2 nm and an anti-fusing voltage VANT applied to a gate electrode was close to about 0 V, current flow was delayed until the voltage reached about 0.5 V. As a result, more current in the conventional anti-fuse flowed through a P-type portion of a substrate.

Furthermore, referring to C2 of FIG. 6, in the anti-fuse 20 having the N$^+$-type channel diffusion region 24 according to the embodiments, when the distance LG was 2 nm and the anti-fusing voltage VANT applied to the gate electrode 28 was close to about 2 V, about the same drain current flowed as when the distance LG was 30 nm (e.g., the current varied between about 1.5 mA to 1.8 mA—only by about 0.3 mA, such that the 30 nm current was approximately only 20% higher than the 2 nm current). However, referring to C2P of FIG. 7, in the conventional anti-fuse without the N$^+$-type channel diffusion region, when the distance LG was 2 nm and the anti-fusing voltage VANT applied to the gate electrode was close to about 2 V, a far smaller drain current flowed than when the distance LG was 30 nm (e.g., the current varied between about 1.0 mA and 1.8 mA—by about 0.8 mA, such that the 30 nm current was approximately 80% higher than the 2 nm current).

Stated in another way, as shown in FIG. 6, if the gate oxide layer breaks at a first distance L1 along the length L of the gate oxide layer (e.g., 2 nm), and a first voltage is applied to the gate electrode, a first current having a first value flows between the gate electrode and ground through the drain region. If the gate oxide layer breaks at a second distance L2 different from L1 along the length L of the gate oxide layer (e.g., 20 nm), and the first voltage is applied to the gate electrode, a second current having a second value flows between the gate electrode and ground through the drain region. As shown as an example in FIG. 6, between 2 V and 3 V on the graph, for any L1 or L2 from a left-most (2 nm) to a right-most distance (35 nm), a variation between the first current and the second current is less than 30% (e.g., the variation at 2 V as described above is approximately 20% and the variation at 3 V is also approximately 20%).

Accordingly, the anti-fuse 20 according to the embodiments exhibits more stable and predictable dispersion characteristics according to the position of a broken point after breakdown or rupture of the gate oxide layer 27 than a conventional anti-fuse.

Since the conventional anti-fuse did not include the N$^+$-type channel diffusion region, the drain current varied significantly with the position of a ruptured point of the thin gate oxide layer. For example, when the breakdown or rupture of the gate oxide layer occurs at a point far away from a drain region, that is, in the left edge of the gate oxide layer, a greater leakage current may flow from a gate terminal to a p-type semiconductor substrate.

Since each of the anti-fuses 10 and 20 of FIGS. 1 and 3 according to the embodiments include the channel diffusion region (14 or 24) having an opposite conductivity type as the bottom portion of the semiconductor substrate (11 or 21), a current path after oxide layer breakdown may lead from a gate terminal to a drain terminal, while minimal or no current may lead from the gate terminal to the opposite-type region (11b or 21b) of the semiconductor substrate.

Figure 8:
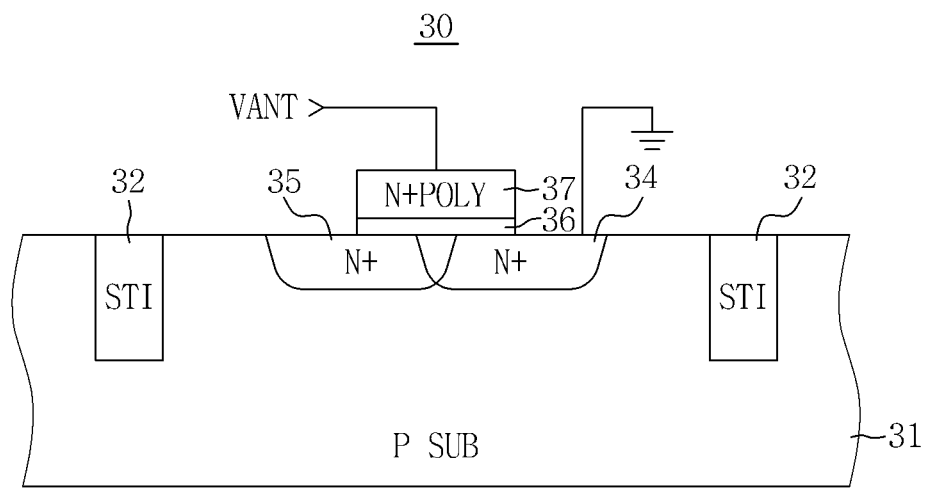
FIG. 8 is a cross-sectional view of a vertical structure of an anti-fuse according to other exemplary embodiments of the inventive concept.

FIG. 8 is a cross-sectional view of a vertical structure of an anti-fuse according to other exemplary embodiments of the inventive concept.

Referring to FIG. 8, an anti-fuse 30 may include a semiconductor substrate 31, an isolation region 32, a gate oxide layer 36, a gate electrode 37, a drain region 34, and a source region 35.

Referring to FIG. 8, in one embodiment, the semiconductor substrate 31 may be formed of a P-type semiconductor material. The drain region 34 and the source region 35 of the semiconductor substrate 31 may be formed of an $N^+$-type semiconductor material having an opposite conductivity type to the semiconductor substrate 31. The drain and source regions 34 and 35 may be formed, for example, using an ion implantation process or a chemical vapor deposition (CVD) process. The isolation region 32 may be formed inward from a top surface of the semiconductor substrate 31. Referring to FIG. 8, the isolation region 32 may be an STI region. The gate electrode 37 may be formed on the gate oxide layer 36 to cover a top surface of the gate oxide layer 36. The gate electrode 37 of the anti-fuse 30 of FIG. 8 may be formed of $N^+$-type poly-Si.

In the anti-fuse 30 of FIG. 8, the drain region 34 and the source region 35, which have an opposite conductivity type to the semiconductor substrate 31, may be formed inward from the top surface of the semiconductor substrate 31. Also, the drain and source regions 34 and 35, which may overlap each other, may be formed by means of an ion implantation process or CVD process using the gate electrode 37 as a mask. When an anti-fusing voltage VANT, which in one embodiment is a high voltage, is applied to the gate electrode 37, and a ground voltage is applied to a drain terminal, the gate oxide layer 36 may be partially broken and a current path may lead from the gate electrode 37 through the $N^+$-type drain and source regions 34 and 35 to the drain terminal. As a result, ohmic contacts may be formed between the gate electrode 37 and the $N^+$-type drain and source regions 34 and 35, and a leakage current flowing from the gate electrode 37 to the P-type semiconductor substrate 31 may be negligible. To preserve the current characteristics, as the gate length of the gate electrode 37 formed of $N^+$-type poly-Si decreases, a portion where the $N^+$-type drain and source regions 34 and 35 overlap each other may be increased.

Thus, since the anti-fuse 30 of FIG. 8 includes the portion where the drain and source regions 34 and 35 overlap each other, unlike the embodiments of FIGS. 1 and 3, when breakdown of the gate oxide layer 36 occurs, a leakage current flowing through a bulk may be reduced without using a channel diffusion region extending from one side of the isolation region 32 to the other. That is, in the embodiment of FIG. 8, outer edges of the source and drain regions 35 and 34 are adjacent the P-type substrate, as opposed to the embodiment of FIGS. 1-4, where outer edges of a channel diffusion region are adjacent to and contact the isolation region.

Figure 9:
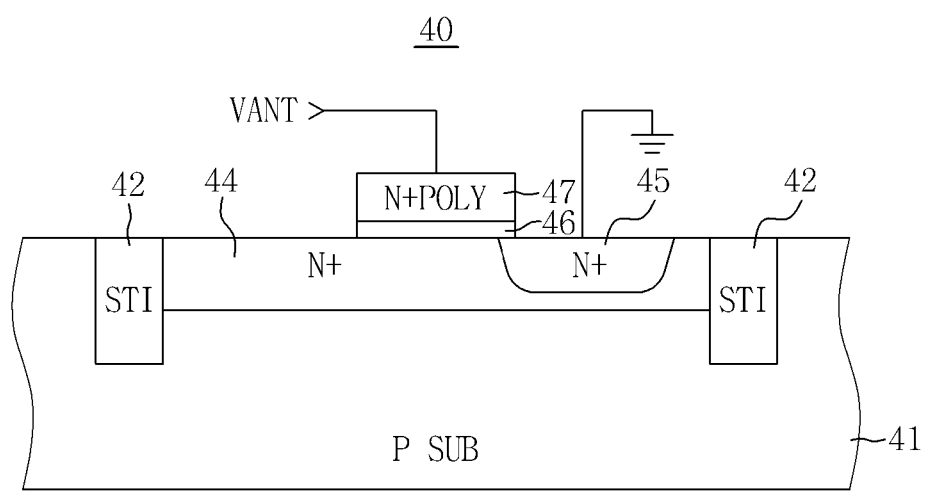
FIG. 9 is a cross-sectional view of a vertical structure of an anti-fuse according to other exemplary embodiments of the inventive concept.

FIG. 9 is a cross-sectional view of a vertical structure of an anti-fuse according to other exemplary embodiments of the inventive concept.

Referring to FIG. 9, an anti-fuse 40 may include a semiconductor substrate 41, an isolation region 42, a channel diffusion region 44, a gate oxide layer 46, a gate electrode 47, and a drain region 45. A portion of the channel diffusion region 44 disposed under the gate oxide layer 46 may correspond to a current path between the gate electrode 47 and a drain terminal.

Referring to FIG. 9, the semiconductor substrate 41 may be formed of a P-type semiconductor material, and the channel diffusion region 44 may be formed of an $N^+$-type semiconductor material having an opposite conductivity type to the semiconductor substrate 41. The isolation region 42 may be formed inward from a top surface of the semiconductor substrate 41. Referring to FIG. 9, the isolation region 42 may be an STI region. The channel diffusion region 44 may be surrounded by the isolation region 42 and formed to a smaller depth than the isolation region 42 inward from the top surface of the semiconductor substrate 41. The channel diffusion region 44 may be formed using an ion implantation process or a CVD process. The gate oxide layer 46 may be formed on the channel diffusion region 44. The gate electrode 47 may be formed on the gate oxide layer 46 to cover a top surface of the gate oxide layer 46. The gate electrode 47 of the anti-fuse 40 of FIG. 9 may be formed of $N^+$-type poly-Si.

In the anti-fuse 40 of FIG. 9, the channel diffusion region 44 may be formed inward from the top surface of the semiconductor substrate 41 to have an opposite conductivity type to the semiconductor substrate 41. When an anti-fusing voltage VANT, which is a high voltage, is applied to the gate electrode 47 and a ground voltage is applied to a drain terminal, the gate oxide layer 46 may be partially broken and a current path may lead from the gate electrode 47 through the $N^+$-type channel diffusion region 44 and the drain region 45 to the drain terminal. Also, an ohmic contact may be formed between the gate electrode 47 and the $N^+$-type channel diffusion region 44, and a parasitic current flowing from the gate electrode 47 to the p-type semiconductor substrate 41 may be negligible. In one embodiment, the drain region 45 may have a higher impurity concentration than the channel diffusion region 44 (e.g., drain region 45 may have a N++ concentration if channel diffusion region 44 has an N+ concentration).

Thus, in the anti-fuse 40 of FIG. 9, the channel may be formed in the $N^+$-type channel diffusion region 44 under the gate oxide layer 46 so that when breakdown of the gate oxide layer 46 occurs, a parasitic current flowing through a bulk may be reduced.

FIGS. 10A through 10E are cross-sectional views illustrating an exemplary process of fabricating an anti-fuse, for example, of FIG. 3.

Figure 10A:
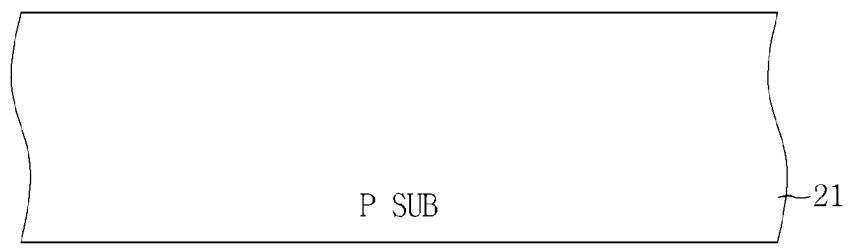
FIGS. 10A through 10E are cross-sectional views illustrating an exemplary process of fabricating the anti-fuse of FIG. 3.
Figure 10B:
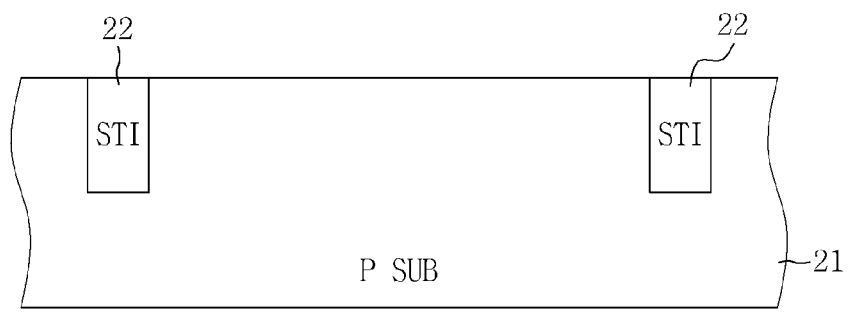
Figure 10C:
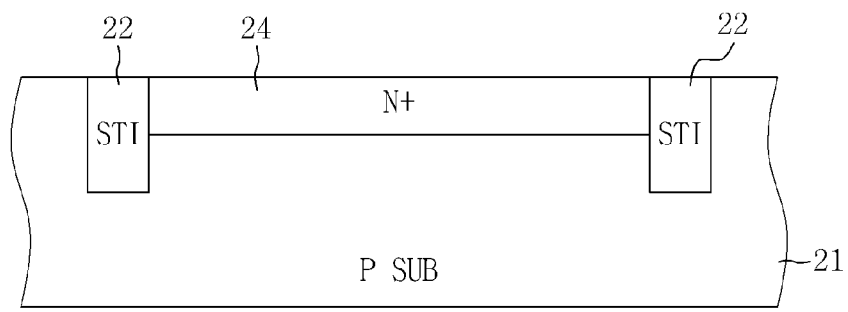
Figure 10D:
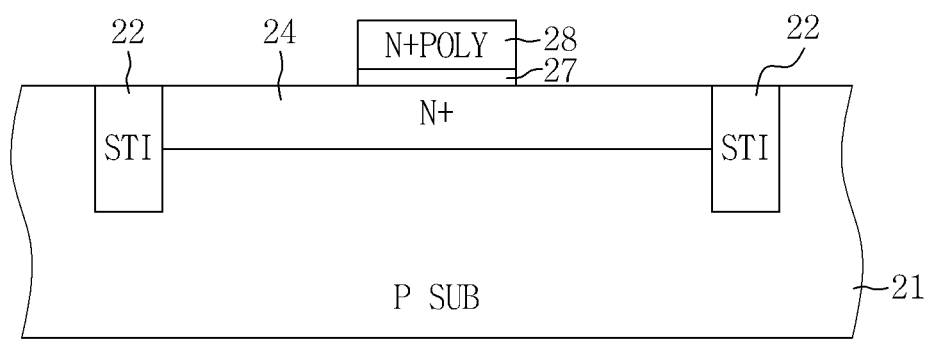
Figure 10E:
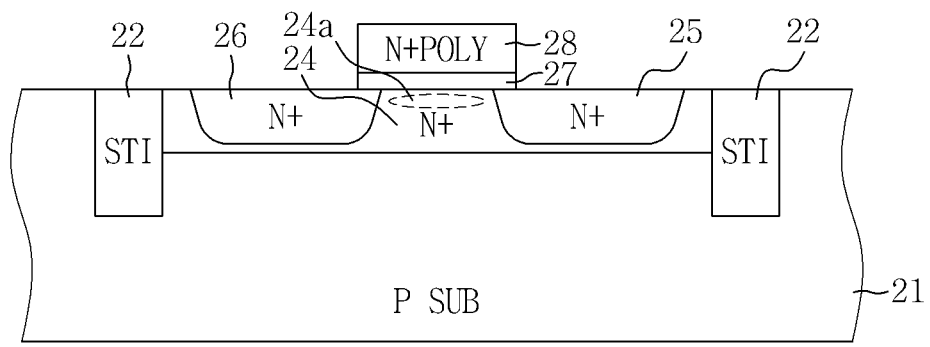

1) A first conductivity-type (e.g., P-type) semiconductor substrate 21 is prepared as shown in FIG. 10A. The semiconductor substrate may be formed of a silicon-based material.
2) An isolation region 22 is formed as shown in FIG. 10B. FIG. 10B illustrates an STI region, which is an example of the isolation region 22. The isolation region 22 may be formed to surround a central portion of the semiconductor substrate 21.
3) A second conductivity-type (e.g., $N^+$-type) channel diffusion region 24 is formed as shown in FIG. 10C. The channel diffusion region 24 may have an opposite conductivity type to the semiconductor substrate 21 and be formed to a smaller depth than the isolation region 22 inward from a top surface of the semiconductor substrate 21. In one embodiment, the channel diffusion region 24 is surrounded by the isolation region 22 and is adjacent to and contacts the isolation region 22 along its edges.
4) A gate oxide layer 27 is formed on a top surface of the $N^+$-type channel diffusion region 24 as shown in FIG. 10D.
5) A gate electrode 28 is formed using $N^+$-type poly-Si as shown in FIG. 10D. The gate electrode 28 may be formed on the gate oxide layer 27 to cover a top surface of the gate oxide layer 27.
6) A drain region 25 and a source region 26 may be formed using the $N^+$-type poly-Si gate electrode 28 as a mask as shown in FIG. 10E. A channel 24a, which is a current path, may thus be formed under the gate oxide layer 27 between the drain and source regions 25 and 26.

Figure 11:
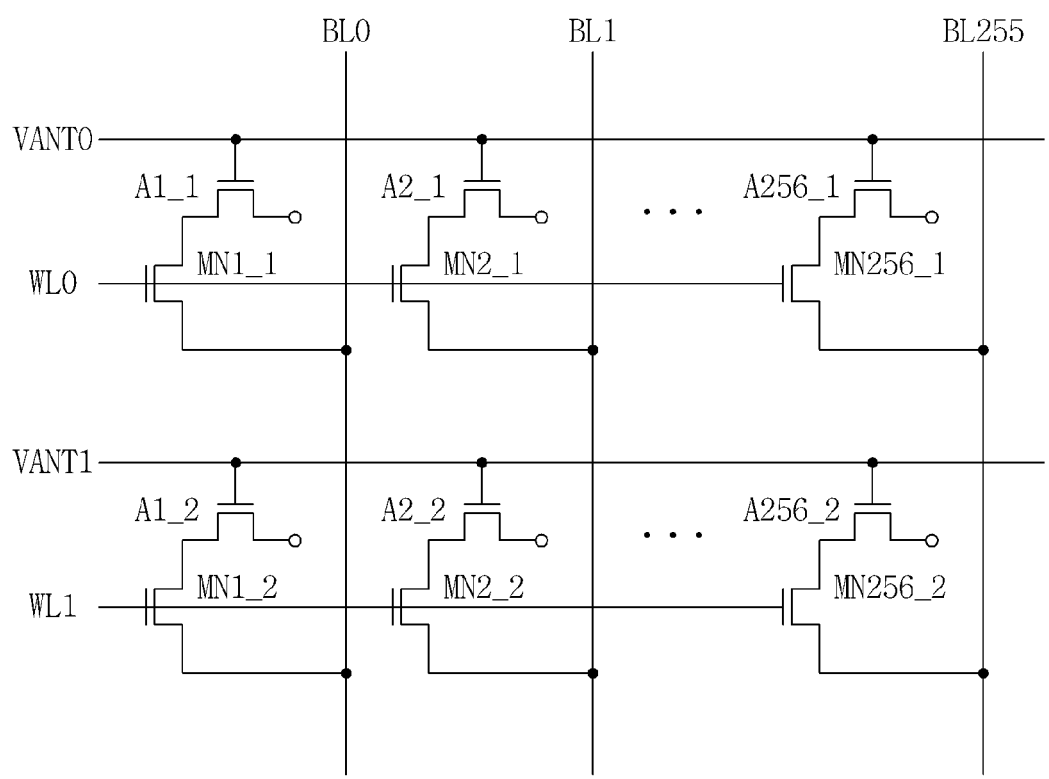
FIG. 11 is an exemplary circuit diagram of an example of an anti-fuse cell array including one of the anti-fuses of FIGS. 1, 3, 8, and 9.

FIG. 11 is a circuit diagram of an example of an anti-fuse cell array including one of the anti-fuses of FIGS. 1, 3, 8, and 9.

Referring to FIG. 11, an anti-fuse cell array 50 may include anti-fuse cells A1_1 to A256_1 and selection transistors MN1_1 to MN256_1 connected in series to the anti-fuse cells A1_1 to A256_1. Also, the anti-fuse cell array 50 may include anti-fuse cells A1_2 to A256_2 and selection transistors MN1_2 to MN256_2 connected in series to the anti-fuse cells A1_2 to A256_2.

An anti-fusing voltage VANT0 may be applied to gates of the respective anti-fuse cells A1_1 to A256_1, and sources of the respective anti-fuse cells A1_1 to A256_1 may be floated. The selection transistors MN1_1 to MN256_1 may have drains, which are respectively electrically connected to drains of the anti-fuse cells A1_1 to A256_1, and gates to which a word line drive signal WL0 is applied. Sources of the selection transistors MN1_1 to MN256_1 may be electrically connected to bit lines BL0 to BL255, respectively.

An anti-fuse voltage VANT1 may be applied to gates of the respective anti-fuse cells A1_2 to A256_2, and sources of the respective anti-fuse cells A1_2 to A256_2 may be floated. The selection transistors MN1_2 to MN256_2 may have drains, which are respectively electrically connected to drains of the anti-fuse cells A1_2 to A256_2, and gates to which a word line drive signal WL1 is applied. Sources of the selection transistors MN1_2 to MN256_2 may be electrically connected to the bit lines BL0 to BL255, respectively.

Hereinafter, operation of the anti-fuse cell array 50 of FIG. 11 will be described.

When the anti-fuse A1_1 is programmed, a high voltage of, for example, about 6 V may be applied as an anti-fusing voltage VANT0 to the gates of the anti-fuse cells A1_1 to A256_1. A voltage VANT0/2 of, for example, about 3 V may be applied to the gate of the selection transistor MN1_1 connected to the drain of the anti-fuse A1_1 to turn on the selection transistor MN1_1. A low electric potential of, for example, 0 V may be applied to the bit line BL0 electrically connected to the source of the selection transistor MN1_1. Under this condition, a thin gate oxide layer of the anti-fuse A1_1 may be broken to form an ohmic contact between a gate electrode and the drain. Thus, a current path may lead from a gate electrode of the anti-fuse A1_1 to the bit line BL0. In this case, a voltage VANT0/2 of, for example, about 3 V may be applied to bit lines electrically connected to unselected cells such that a high voltage is not applied to both ends of the gate oxide layer of the anti-fuse A1_1. Also, a low voltage of, for example, 0 V may be applied to gates of the anti-fuse cells A1_2 to A256_2 to be unprogrammed so that unselected anti-fuse cells may not be programmed.

As described above, each of the anti-fuse cells A1_1 to A256_1 and A1_2 to A256_2 of FIG. 11 may include an anti-fuse. The anti-fuse may include a channel diffusion region 14, which may be formed using an ion implantation process or a CVD process to a smaller depth than the isolation region 12 inward from a top surface of the semiconductor substrate (refer to 11 in FIG. 1). Also, the anti-fuse may include a drain region and a source region, which may be formed in the channel diffusion region 14 and have the same conductivity type as the diffusion region 14. In another case, the anti-fuse may not include a channel diffusion region but a source region and a drain region that overlap each other so that a complete ohmic contact may be formed between a gate electrode and a channel and a leakage current flowing to a semiconductor substrate may be reduced.

Figure 12:
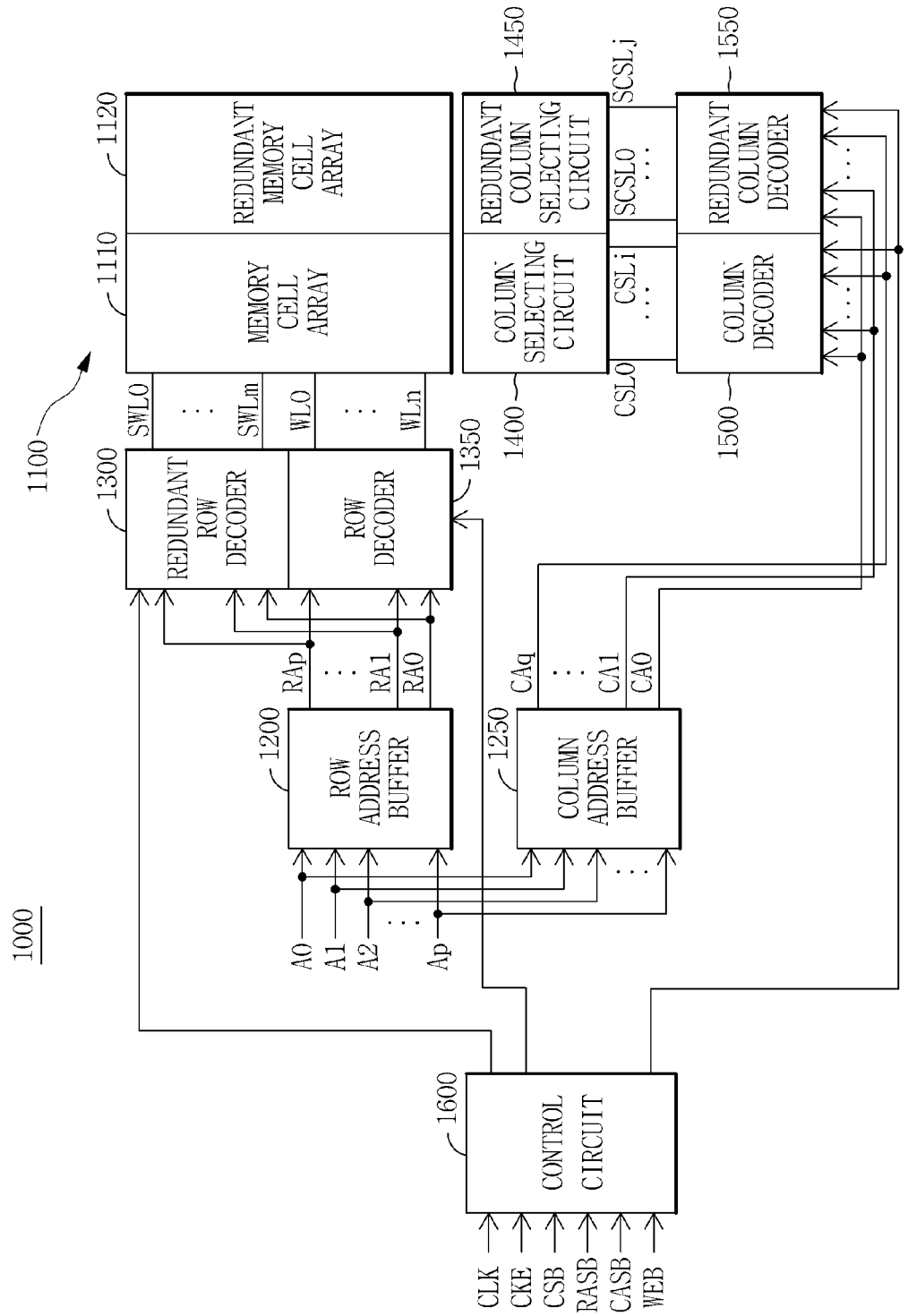
FIG. 12 is a block diagram of an example of a semiconductor memory device including an anti-fuse according to exemplary embodiments of the inventive concept.

FIG. 12 is a block diagram of an example of a semiconductor memory device including an anti-fuse according to exemplary embodiments of the inventive concept.

Referring to FIG. 12, a semiconductor memory device 100 may include a memory cell array 1100, a row address buffer 1200, a column address buffer 1250, a row decoder 1350, a redundant row decoder 1300, a column decoder 1500, a redundant column decoder 1550, a column selection circuit 1400, and a redundant column selection circuit 1450. Also, the semiconductor memory device 1000 may include a control circuit 1600 configured to generate control signals in response to command signals, such as a clock signal CLK, a clock enable signal CKE, a chip selection signal CSB, a row address strobe signal RASB, a column address strobe signal CASB, and a write enable signal WEB and control blocks of the semiconductor memory device 1000.

The memory cell array 1100 may include a normal memory cell array 1110, which may be connected to word lines and column selection lines, and a redundant memory cell array 1120, which may be connected to redundant word lines and redundant column selection lines. The row address buffer 1200 may buffer address signals A0, A1, . . . , and Ap and generate row address signals RA0, RA1, . . . , and RAp. The column address buffer 1250 may buffer address signals A0, A1, . . . , and Ap and generate column address signals CA0, CA1, . . . , and CAq.

The row decoder 1350 may decode the row address signals RA0, RA1, . . . , and Rap, generate word line drive signals WL0, . . . , and WLn, and transmit the word line drive signals WL0, . . . , and WLn to the word lines. When a defect occurs in at least one of the word lines, the redundant row decoder 1300 may decode the row address signals RA0, RA1, . . . , and Rap, generate redundant word line drive signals SWL0, . . . , and SWLm, and transmit the redundant word line drive signals SWL0, . . . , and SWLm to the redundant word lines.

The column decoder 1500 may decode the column address signals CA0, CA1, . . . , and CAq, generate column selection signals CSL0, . . . , and CSLi, and transmit the column selection signals CSL0, . . . , and CSLi to the column selection lines. When a defect occurs in at least one of the column selection lines or in one of the column decoder 1500 or the column selecting circuit 1400, the redundant column decoder 1550 may decode the column address signals CA0, CA1, . . . , and CAq, generate redundant column selection signals SCSL0, . . . , and SCSLj, and transmit the redundant column selection signals SCSL0, . . . , and SCSLj to the redundant column selection lines.

The column selection circuit 1400 may amplify the column selection signals CSL0, . . . , and CSLi and control input/output (I/O) of data to/from the normal memory array 1110. The redundant column selection circuit 1450 may amplify the redundant column selection signals SCSL0, . . . , and SCSLj and control I/O of data to/from the redundant memory cell array 1120.

The redundant row decoder 1300 and/or the redundant column decoder 1550 of the semiconductor memory device 1000 of FIG. 12 may include one of the anti-fuses according to the embodiments of the inventive concept. In the anti-fuse included in the redundant row decoder 1300 and/or the redundant column decoder 1550 of the semiconductor memory device 1000, when a gate oxide layer is broken, an ohmic contact may be formed between a gate electrode and a channel. Thus, the anti-fuse may reduce a leakage current flowing through a semiconductor substrate, and a large current of the anti-fuse may flow from a gate terminal to a drain terminal.

Thus, when a normal memory cell array includes a defective cell, the semiconductor memory device 1000 may safely replace the defective cell by a redundant memory cell without causing significant current leakage.

Although FIG. 12 illustrates the semiconductor memory device 100 including both the redundant row decoder 1300 and the redundant column decoder 1550, the semiconductor memory device 100 may include only one of the redundant row decoder 1300 and the redundant column decoder 1550.

Figure 13:
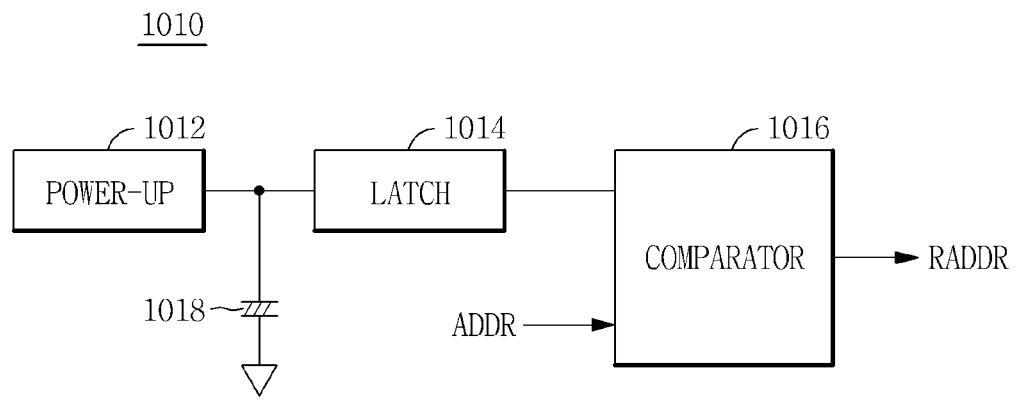
FIG. 13 is a circuit diagram of an example of an anti-fuse circuit including an anti-fuse according to exemplary embodiments of the inventive concept.

FIG. 13 is a circuit diagram of an example of an anti-fuse circuit including an anti-fuse according to exemplary embodiments of the inventive concept.

Referring to FIG. 13, an anti-fuse circuit 1010 may be included in a redundant row decoder 1300 and/or a redundant column decoder 1550. The anti-fuse circuit 1010 may include a power-up circuit 1012, a latch circuit 1014, a comparator 1016, and an anti-fuse 1018. The anti-fuse circuit 1010 may be used to indicate memory cell addresses of defective memory cells to enable use of redundant memory cells. The anti-fuse circuit 1018 may be combined with the power-up circuit 1012 and the latch circuit 1014. The power-up circuit 1012 may be used to read a state of the anti-fuse 1018 when a semiconductor memory device is initially turned on, while the latch circuit 1014 may be used to latch the state of the anti-fuse 1018 during a normal operation. The comparator 1016 may compare addresses ADDR with the output of the latch circuit 1014, that is, a voltage level of the anti-fuse 1018 and generate addresses of the redundant memory cells.

The anti-fuse circuit 1010 of FIG. 13 may be applied not only to the redundant row decoder 1300 and the redundant column decoder 1550 but also to an arbitrary desired circuit block of a semiconductor device.

Figure 14:
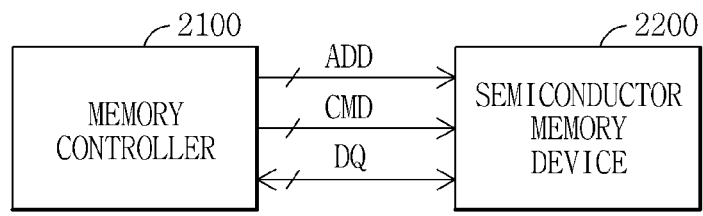
FIG. 14 is a block diagram of an example of a memory system including the semiconductor memory device of FIG. 12.

FIG. 14 is a block diagram of an example of a memory system including the semiconductor memory device of FIG. 12.

Referring to FIG. 14, a memory system 2000 may include a memory controller 2100 and a semiconductor memory device 2200.

The memory controller 2100 may generate an address signal ADD and a command CMD and transmit the address signal ADD and the command CMD to the semiconductor memory device 2200 through buses. Data DQ may be transmitted from the memory controller 2100 through the buses to the semiconductor memory device 2200 and transmitted from the semiconductor memory device 2200 through the buses to the memory controller 2100.

The semiconductor memory device 2200 may include an anti-fuse, which may replace some circuits of the semiconductor memory device 2200 with other circuits according to conditions. The anti-fuse may include a channel diffusion region 14, which may be formed using an ion implantation process or a CVD process to a smaller depth than the isolation region 12 inward from a top surface of the semiconductor substrate (refer to FIG. 1). Also, the anti-fuse may include a drain region and a source region, which may be formed in the channel diffusion region 14 to have the same conductivity type as the channel diffusion region 14. In another case, the anti-fuse may include not a channel diffusion region but a source region and a drain region that overlap each other so that a complete ohmic contact may be formed between a gate electrode and a channel and a leakage current flowing to a semiconductor substrate may be reduced. As a gate length of the anti-fuse decreases, a portion where $n^+$-type drain and source regions 34 and 35 overlap each other may increase.

Figure 15:
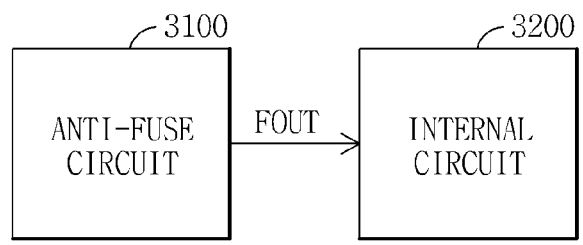
FIG. 15 is a block diagram of an example of a semiconductor device including an anti-fuse according to exemplary embodiments of the inventive concept.

FIG. 15 is a block diagram of a semiconductor device including an anti-fuse according to embodiments of the inventive concept.

Referring to FIG. 15, a semiconductor device 3000 may include an anti-fuse circuit 3100 and an internal circuit 3200.

The anti-fuse circuit 3100 may include an anti-fuse, which may include a channel diffusion region 24. The channel diffusion region 24 may be formed using an ion implantation process or a CVD process to a smaller depth than an isolation region 12 inward from a top surface of the semiconductor substrate (refer to FIG. 1). Also, the anti-fuse may include a drain region and a source region, which may be formed in the channel diffusion region 24 to have the same conductivity type as the channel diffusion region 24. In another case, the anti-fuse may include not a channel diffusion region but a source region and a drain region that overlap each other so that a complete ohmic contact may be formed between a gate electrode and a channel and a leakage current flowing to a semiconductor substrate may be reduced. The anti-fuse circuit 3100 may perform an anti-fusing operation and generate an anti-fuse output voltage FOUT. The internal circuit 3200 may perform a specific operation in response to the anti-fuse output voltage FOUT. The specific operation may include selecting an operation mode of the semiconductor device 3000 or enabling a redundancy array when a defective cell is included in a memory cell array.

The present inventive concept may be applied to a semiconductor memory device, particularly, a semiconductor memory device having a stacked structure. In addition, it may apply to different types of memories, such as volatile or nonvolatile memories, including, for example, DRAM, SRAM, NAND or NOR flash memory, PRAM, MRAM, RRAM, etc.

An anti-fuse according to embodiments of the inventive concept may include a channel diffusion region, which may be formed using an ion implantation process or a CVD process to a smaller depth than an isolation region inward from a top surface of a semiconductor substrate. Also, an anti-fuse according to other embodiments may include not a channel diffusion region but a source region and a drain region that overlap each other. Thus, the anti-fuses according to the embodiments may include a complete ohmic contact formed between a gate electrode and a channel and reduce a leakage current flowing to a semiconductor substrate. Furthermore, an anti-fuse according to embodiments may improve a dispersion characteristic according to the position of a broken point after breakdown or rupture of a gate oxide layer. Therefore, the anti-fuse according to the embodiments may perform an anti-fusing operation more precisely.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A semiconductor device including an anti-fuse, the anti-fuse comprising:
   a semiconductor substrate including a top surface and a bottom portion, the bottom portion of the semiconductor substrate having a first conductivity type;
   an isolation region disposed inward from the top surface of the semiconductor substrate to a first depth;
   a channel diffusion region disposed inward from the top surface of the semiconductor substrate to a second depth, the second depth located at a depth where the channel diffusion region meets an upper boundary of the bottom portion of the semiconductor substrate,
   wherein the channel diffusion region is surrounded by the isolation region,
   wherein the first depth is a greater distance from the top surface of the semiconductor substrate than the second depth, and
   wherein the channel diffusion region has a second conductivity type opposite to the first conductivity type;
   a gate oxide layer disposed on the channel diffusion region; and
   a gate electrode disposed on the gate oxide layer to cover a top surface of the gate oxide layer;
   the semiconductor device further including:
   a memory cell array connected to word lines and column selection lines;
   a column decoder configured to decode column address signals, generate column selection signals, and transmit the column selection signals to the column selection lines;
   a row decoder configured to decode row address signal and generate row address signals; and
   one or more of:
      a redundant memory cell array connected to redundant word lines and redundant column selection lines;
      a redundant column decoder configured to decode the column address signals, generate redundant column selection signals, and transmit the redundant columns selection signals to the redundant column selection lines when a defect occurs in the column decoder or at least one of the column selection lines, and
      a redundant row decoder configured to decode the row address signals and generate redundant row address signals when a defect occurs in the decoder.

2. The semiconductor device of claim 1 wherein the gate electrode has the second conductivity type.

3. The semiconductor device of claim 1, wherein the isolation region is a shallow trench isolation (STI) region.

4. The semiconductor device of claim 1, further comprising:
   a drain region partially overlapping the gate oxide layer, the drain region formed inward from the surface of the channel diffusion region, and having the second conductivity type; and
   a source region partially overlapping the gate oxide layer, the source region formed at a first distance from the drain region in a horizontal direction, and having the second conductivity type.

5. The semiconductor device of claim 4, wherein a first edge of the channel diffusion region is adjacent to the isolation region, and a second edge opposite to the first edge is also adjacent to the isolation region.

6. The semiconductor device of claim 4, wherein each of the drain region and source region has an impurity concentration higher than an impurity concentration of the channel diffusion region.

7. The semiconductor device of claim 4, wherein:
   the gate electrode is connected to a voltage source;
   the drain region is connected to a ground; and
   the source region is floating.

8. The semiconductor device of claim 7, wherein the anti-fuse is configured such that:
   the gate oxide layer is configured to break, forming an ohmic contact between the gate electrode and the substrate; and
   after the gate oxide layer is broken, when a voltage is applied to the gate electrode, a current flows from the gate electrode to ground through the drain region.

9. An anti-fuse, comprising:
   a semiconductor substrate including a top surface and a bottom portion, the bottom portion of the semiconductor substrate having a first conductivity type;
   an isolation region disposed inward from the top surface of the semiconductor substrate to a first depth;
   a channel diffusion region disposed inward from the top surface of the semiconductor substrate to a second depth, the second depth located at a depth where the channel diffusion region meets an upper boundary of the bottom portion of the semiconductor substrate,
   wherein the channel diffusion region is surrounded by the isolation region,
   wherein the first depth is greater distance from the top surface of the semiconductor substrate than the second depth, and
   wherein the channel diffusion region has a second conductivity type opposite to the first conductivity type;
   a gate oxide layer disposed on the channel diffusion region;
   a gate electrode disposed, on the gate oxide layer to cover a top surface of the gate oxide layer;
   a drain region partially overlapping the gate oxide layer, the drain region formed inward from the surface of the channel diffusion region, and having the second conductivity type; and
   a source region partially overlapping the gate oxide layer, the source region formed at a first distance from the drain region in a horizontal direction, and having the second conductivity type, wherein:
   the gate oxide layer has a length of L in the horizontal direction; and
   the anti-fuse is configured such that gate oxide layer is configured to break, forming a ohmic contact between the gate electrode and the semiconductor substrate, and
   if the gate oxide layer breaks at a first distance L1 along the length L of the gate oxide layer, and a first voltage is applied to the gate electrode, a first current having a first value flows between the gate electrode and ground through the drain region,
   if the gate oxide layer breaks at a second distance L2 different from L1 along the length L of the gate oxide layer, and the first voltage is applied to the gate electrode, a second current having a second value flows between the gate electrode and ground through the drain region, wherein
   for any L1 or L2 wherein a first voltage between 2 V and 3 V is applied to the gate electrode, a variation between the first current and the second current is less than 30%.

10. The semiconductor device of claim 1, wherein the anti-fuse is part of an anti-fuse circuit comprising:
   a plurality of anti-fuse cells, one including the anti-fuse, each anti-fuse cell disposed to a smaller depth than an isolation region inward from a top surface of the semiconductor substrate and having a channel diffusion region having a conductivity type opposite to a conductivity type of the semiconductor substrate, a gate to which a first voltage is applied, and a floated source; and a plurality of transistors, each transistor having a drain connected to a corresponding one of the anti-fuse cells, a gate to which a word line drive signal is applied, and a source connected to a corresponding bit line.

11. The semiconductor device of claim 10, wherein in a program mode, the first voltage is applied to a gate of each of the anti-fuse cells, and a low voltage is applied to a bit line electrically connected to an anti-fuse cell to be programmed.

12. The semiconductor device of claim 10, wherein in a program mode, the word line drive signal has a half voltage level of the first voltage.

13. The semiconductor device of claim 10, wherein in a program mode, a voltage having a half voltage level of the first voltage is applied to a bit line electrically connected to an anti-fuse cell to be unprogrammed.

14. A semiconductor device, comprising:
a plurality of anti-fuse cells adjacent each other, each cell including:
a semiconductor substrate including a top surface, the semiconductor substrate comprising a first region extending inward from the top surface of the semiconductor substrate to a first depth and having a first conductivity type, and a second region extending from the first depth toward a bottom of the semiconductor substrate and having a second conductivity type opposite the first conductivity type,
a gate oxide layer disposed on the first region, and
a gate electrode disposed on the gate oxide layer to cover a top surface of the gate oxide layer;
a plurality of isolation regions extending inward from the top surface to a second depth greater than the first depth, each isolation region surrounding a respective anti-fuse cell, and separating the respective anti-fuse cell from an adjacent anti-fuse cell;
a memory cell array connected to word lines and column selection lines;
a column decoder configured to decode column address signals, generate column selection signals, and transmit the column selection signals to the column selection lines;
a row decoder configured to decode row address signals and generate row address signals; and
one or more of:
a redundant memory cell array connected to redundant word lines and redundant column selection lines
a redundant column decoder configured to decode the column address signals, generate redundant column selection signals, and transmit the redundant column selection signals to the redundant column selection lines when a defect occurs in the column decoder or at least one of the column selection lines, and
a redundant row decoder configured to decode the row address signals and generate redundant row address signals when a defect occurs in the row decoder.

15. The semiconductor device of claim 14, wherein:
the second region extends below the first region for each cell as well as below the plurality of isolation regions.

16. The semiconductor device of claim 14, wherein for each cell, the gate electrode has the first conductivity type.

17. The semiconductor device of claim 14, wherein for each cell:
the first region includes a source region and a drain region;
the gate electrode is connected to a voltage source;
the drain region is connected to a ground; and
the source region is floating.

18. The semiconductor device of claim 17, wherein for each cell:
the gate oxide layer is configured to break, forming an ohmic contact between the gate electrode and the substrate;
after the gate oxide layer is broken, when a voltage is applied to the gate electrode, a current flows from the gate electrode to ground through the drain region;
the gate oxide layer has a length of L in the horizontal direction; and
the cell is configured such that:
if the gate oxide layer breaks at a first distance L1 along the length L of the gate oxide layer, and a first voltage is applied to the gate electrode, a first current having a first value flows between the gate electrode and ground through the drain region, and
if the gate oxide layer breaks at a second distance L2 different from L1 along the length L of the gate oxide layer, and the first voltage is applied to the gate electrode, a second current having a second value flows between the gate electrode and ground through the drain region, wherein
for any L1 or L2 wherein a first voltage between 2 V and 3 V is applied to the gate electrode, a variation between the first current and the second current is less than 30%.

19. A semiconductor device comprising:
a first circuit block configured to perform an operation;
a redundant circuit block configured to perform the operation; and
an anti-fuse circuit included in the redundant circuit block and electrically connected to a voltage source, the anti-fuse circuit configured to activate the redundant circuit block by applying a voltage from the voltage source to the redundant circuit block, wherein the anti-fuse circuit includes:
a plurality of anti-fuse cells adjacent each other, each cell including:
a semiconductor substrate including a top surface, the semiconductor substrate comprising a first region extending inward from the top surface of the semiconductor substrate to a first depth and having a first conductivity type, and a second region extending from the first depth toward a bottom of the semiconductor substrate and having a second conductivity type opposite the first conductivity type,
a gate oxide layer disposed on the first region, and
a gate electrode disposed on the gate oxide layer to cover a top surface of the gate oxide layer, the gate electrode connected to the voltage source; and
a plurality of isolation regions extending inward from the top surface to a second depth greater than the first depth, each isolation region surrounding a respective anti-fuse cell, and separating the respective anti-fuse cell from an adjacent anti-fuse cell;
wherein for each cell;
the first region includes a source region and a drain region;
the gate electrode is connected to a voltage source;
the drain region is connected to a ground;
the source region is floating;
the gate oxide layer is configured to break, forming an ohmic contact between the gate electrode and the semiconductor substrate;
after the gate layer is broken, when a voltage is applied to the gate electrode, a current flows from the gate electrode to ground through the drain region;
the gate oxide layer has a length of L in the horizontal direction; and the cell is configured such that:

if the gate oxide layer breaks at a first distance L1 along the length L of the gate oxide layer, and a first voltage is applied to the gate electrode, a first current having a first value flows between the gate electrode and ground through the drain region, and if the gate oxide layer breaks at a second distance L2 different from L1 along the length L of the gate oxide layer, and the first voltage is applied to the gate electrode, a second current having a second value flows between the gate electrode and ground through the drain region, wherein for any L1 or L2 wherein a first voltage between 2 V and 3 V is applied to the gate electrode, a variation between the first current and the second current is less than 30%.

20. The semiconductor device of claim 1, wherein at least one of the redundant memory cell array, the redundant column decoder, and the redundant row decoder includes the plurality of anti-fuse cells and the plurality of isolation regions.

21. The semiconductor device of claim 1, wherein at least one of the redundant memory cell array, the redundant column decoder, and the redundant row decoder includes the plurality of anti-fuse cells and the plurality of isolation regions.

* * * * *